United States Patent [19]
Nishimura et al.

[11] 3,950,940
[45] Apr. 20, 1976

[54] ELECTRONIC TIMEPIECE

[75] Inventors: Izuhiko Nishimura; Satoshi Fushimi, both of Suwa, Japan

[73] Assignee: Kabushiki Kaisha Suwa Seikosha, Tokyo, Japan

[22] Filed: Aug. 2, 1974

[21] Appl. No.: 494,680

[30] Foreign Application Priority Data
Aug. 2, 1973  Japan.................................. 48-87155

[52] U.S. Cl. ............................... 58/23 A; 58/50 R; 307/DIG. 1
[51] Int. Cl.² ...................... G04C 3/00; G04B 19/30
[58] Field of Search ............... 58/23 R, 23 A, 50 R; 307/DIG. 1, 304; 340/336; 357/42

[56] References Cited
UNITED STATES PATENTS

| | | | |
|---|---|---|---|
| 3,675,043 | 7/1972 | Bell...................................... | 307/205 |
| 3,701,249 | 10/1972 | Bergey et al........................ | 58/50 R |
| 3,757,510 | 9/1972 | Dill...................................... | 58/50 R |
| 3,803,827 | 4/1974 | Roberts............................... | 58/4 A |
| 3,820,108 | 6/1974 | Luce.................................... | 340/336 |
| 3,860,830 | 1/1975 | Akio et al........................... | 307/DIG. 1 |

*Primary Examiner*—Edith Simmons Jackmon
*Attorney, Agent, or Firm*—Blum, Moscovitz, Friedman & Kaplan

[57] ABSTRACT

An electronic timepiece having the electronic circuitry formed as a single monolithically integrated circuit chip is provided, a first portion of the circuitry being actuated by a first potential and a second portion of the circuitry being actuated by a second potential higher than said first. The circuit chip includes complementary coupled MOS transistors, the first and second circuit portions operating respectively at first and second logic levels. An interface is provided intermediate said first and second circuit portions, the interface being adapted to effect an interfacing of said logic levels, and an electrical insulation of said first and second circuit portions.

6 Claims, 3 Drawing Figures

ELECTRONIC TIMEPIECE

BACKGROUND OF THE INVENTION

This invention relates to an electronic timepiece and in particular to an electronic timepiece having a monolithically integrated circuitry actuated by potentials of differing magnitude.

Because the power consumption of the electronic circuitry in an electronic timepiece has been significantly reduced by the use of complementary metal oxide semiconductor (C-MOS) transistors, their use has gained wide acceptance. Nevertheless, the power consumption of C-MOS transistors is relatively higher in the electronic timepiece circuit portions operating at high frequency signals such as the oscillating circuit and the high frequency divider stages of the frequency divider circuit, so that it is desirable that such circuits be actuated by potentials maintained at as low a level as possible. On the other hand, the driving circuit portion utilized to drive a time display requires considerably more power and is actuated at a higher potential than the higher frequency circuit portions. Moreover, as time display mechanisms have progressed from analogue systems utilizing hands and a dial disc, to digital systems utilizing light-emitting diodes or liquid crystals, a larger current and higher voltage has been required to drive same. Thus, the potential at which the different circuit portions in an electronic timepiece operate at optimal efficiency are different.

Heretofore, electronic watch circuitry has been monolithically integrated into a single circuit chip and a single power source utilized to actuate all the circuitry at one potential or separate chips are provided for the low and high potential circuit portions. When a digital display is comprised of liquid crystals, the driving circuit requires a relatively high voltage in the range of 3 to 6 volts. Nevertheless, such a range causes unnecessarily high breakdown voltages in the high frequency circuit elements such as the oscillator and dividing circuits, the consequence thereof being the necessity to increase the size of the chip and hence increase the power consumption thereof.

On the other hand, when light-emitting diodes are utilized, although such light-emitting diodes are capable of being actuated by low voltages in the range of 1.5 volts, such light-emitting diodes require relatively large currents. Thus, if a potential of 1.5 volts is utilized, it is impossible to drive the display because enough current is not available making it necessary to increase the size of the driving circuit for driving the light-emitting diode display.

SUMMARY OF THE INVENTION

Generally speaking, in accordance with the invention, electronic timepiece circuitry is monolithically integrated into a single circuit chip and the circuitry is actuated by a first and second potential. The operative circuits of the timepiece are monolithically integrated to a single circuit chip, the circuit chip being formed from complementary coupled MOS transistors. The circuit chip includes a first operative circuit portion adapted to be energized at a first potential to thereby operate at a first logic level. A second circuit portion is energized at a second potential higher than said first potential to operate said second portion at a second logic level. An interface is provided intermediate said first and second circuit portions, said interface being adapted to effect an interfacing of said first and second logic levels and to further electrically insulate said first and second circuit portions.

Accordingly, it is an object of this invention to provide an improved electronic timepiece having minimal power consumption.

Another object of this invention is to provide an improved electronic timepiece wherein the oscillator and dividing circuits are actuated by a first potential and the display driving circuit is actuated at a second but higher potential than said divider and oscillator circuits.

Still another object of this invention is to provide an electronic timepiece circuit wherein the circuitry is monolithically integrated into a single circuit chip to thereby reduce the cost thereof yet provide sufficient and differing actuating voltages to operate same.

Still other objects and advantages of the invention will in part be obvious and will in part be apparent from the specification.

The invention accordingly comprises the features of construction, combination of elements and arrangement of parts which will be exemplified in the construction hereinafter set forth and the scope of the invention will be indicated in the claims.

BRIEF DESCRIPTION OF THE PREFERRED EMBODIMENT

DETAILED DESCRIPTION OF THE PREFERRED EMBODIMENT

Figure 1:
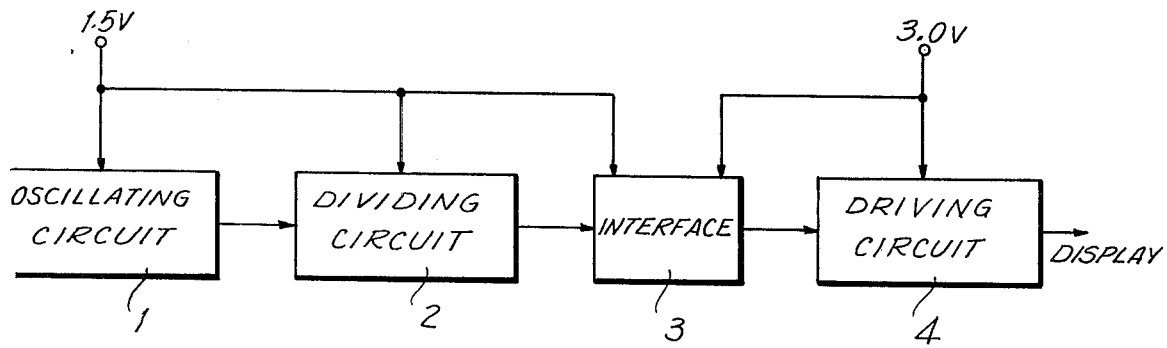
FIG. 1 is a block circuit diagram of an electronic timepiece constructed in accordance with the instant invention.

Reference is now made to FIG. 1 wherein a block circuit diagram illustrating an electronic timepiece constructed in accordance with the instant invention is depicted. A quartz crystal oscillator circuit 1 is adapted to supply a high frequency time standard signal to a divider circuit 2. Divider circuit 2 is adapted to produce low frequency timekeeping signals in response to the time standard signals. Divider circuit 2 and oscillator circuit 1 are energized by a power source operating at a potential of 1.5 volts. A driving circuit 4 is adapted to drive a digital display in response to the low frequency timekeeping signals produced by divider circuit 2. The driving circuit 4 is actuated by a power source having a higher potential than the voltage source actuating the oscillator circuit 1 and divider circuit 2, the desired voltage for an electronic time-piece driving circuit being 3.0 volts. An interface 3 is integrated into the circuit chip intermediate the output of divider circuit 2 and the input of the driving circuit 4. The interface is adapted to effect an interfacing of the logic levels at which the divider circuit 2 and the driving circuit 4 operate and to enable same to be utilized in the same electronic circuit chip.

It is noted, that when circuit portions are monolithically integrated into a single circuit chip and each of the circuit portions are operated at different potentials, such operation is usually less than completely satisfactory. A first problem is that the respective circuit portions operate at different potentials and therefore must be electrically insulated from each other. For example, if an N-type substrate is utilized, it is necessary to make the circuit portions supplied with a higher potential operate at a common potential and to physically separate same from other P-type islands actuated at lower potentials. This is particularly the case in a C-MOS element where the P-channel transistors are constructed in an N-type substrate and the N-channel transistors are formed in a P-type island.

Figure 2:
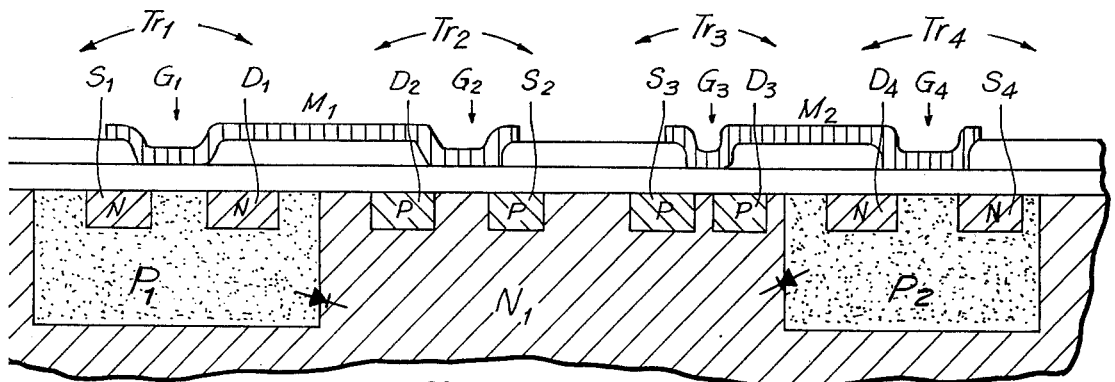
FIG. 2 is a sectional view of an integrated circuit chip utilied in the electronic timepiece circuit depicted in FIG. 1.

Reference is now made to FIG. 2 wherein a monolithically integrated circuit chip for use in the circuit illustrated in FIG. 1 is depicted. It is noted that in the $N_1$ substrate, P-type islands $P_1$ and $P_2$ are diffused. Moreover, N-type impurities are diffused into each P-type island and P-type impurities are diffused into the N-type substrate to define the source and drain regions of transistors $Tr_1$ to $Tr_4$. The drains $D_1$ and $D_2$ of transistors $Tr_1$ and $Tr_2$ are coupled together, as are the drains $D_3$ and $D_4$ of transistors $Tr_3$ and $Tr_4$, to define complementary inverters. The gate regions $G_1$ and $G_2$, and $G_3$ and $G_4$, are coupled together by electrodes $M_1$ and $M_2$ respectively. Each of the sources $S_1$ to $S_4$ is connected with a substrate in which the source is diffused, for example, an N-type substrate such as $N_1$ or P-type island such as $P_1$ and $P_2$. Furthermore, the substrate $N_1$ is connected to portions supplied in common with the high potential of two power sources while $P_1$ and $P_2$ are connected with the lower potential circuit portions. Since $P_1$ and $P_2$ are reverse biased with respect to $N_1$, $P_1$ and $P_2$ are electrically insulated from each other. Thus, it is easy to utilize different potentials to actuate different circuit portions to thereby effect a more efficient operation of the electronic timepiece circuitry.

Figure 3:
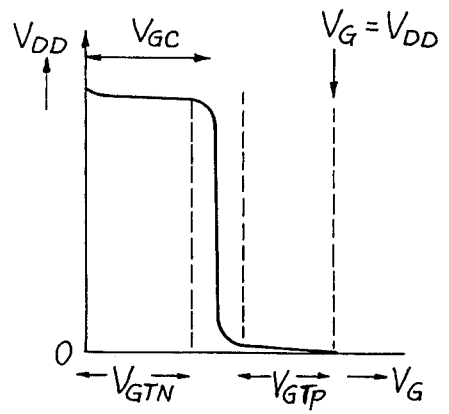
FIG. 3 is a graphical representation of the gate threshold voltage and drain threshold voltage when an integrated circuit chip including a C-MOS inverter is constructed in accordance with the instant invention.

When the C-MOS inverter is comprised of a pair of P-channel and N-channel C-MOS transistors, the relation between the drain voltage and the gate voltage is illustrated in FIG. 3. When the threshold voltage $V_{GTN}$ and $V_{GTP}$ of the N-channel and the P-channel transistors are nearly equal, the gate-switching voltage $V_{GC}$ of the inverter is approximately half of the supply voltage $V_{DD}$.

$$V_{GC} \approx \frac{1}{2} V_{DD}$$

Accordingly, in the case of a C-MOS circuit portions actuated at two differing potentials different logic levels are generated in the circuits portions corresponding to the different potentials. Therefore, it is necessary to provide an interface 3 for interfacing the different logic levels generated in the two different circuit portions by the different potentials.

As noted above, this invention is particularly suitable for application to the electronic timepiece circuits currently used. Moreover, the oscillator circuit 1 and dividing circuit 2 can be actuated at very low voltages thereby minimizing power consumption while driving circuit 4 for driving a digital display can be operated at an efficient potential. Furthermore, the circuit chip can be miniaturized to make same particularly suitable for small-sized wristwatches. Moreover, the operation of the timepiece at two separate potentials renders the timepiece circuitry particularly suited for use with liquid crystal digital display elements.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. In an electronic timepiece having the operative circuits thereof monolithically integrated into a single circuit chip, said circuit chip including complementary coupled MOS transistors, the improvement comprising a circuit chip including a first complementary coupled MOS transistor operative circuit portion adapted to be energized by a first potential to thereby operate at a first logic level and a second complementary coupled MOS transistor circuit portion energized at a second potential higher than said first potential to operate at a second logic level, and interface means between said first and second complementary coupled MOS transistor portions, said interface means interfacing said first and second logic levels, and electrically insulating said first and second circuit portions.

2. An electronic timepiece as claimed in claim 1, wherein said first circuit portion defines a quartz crystal oscillator circuit for producing a high frequency time standard signal and a divider circuit for producing low frequency timekeeping signals in response to said high frequency time standard signal.

3. An electronic timepiece as claimed in claim 1, wherein said second circuit portion defines a driving circuit for supplying driving signals to a digital display.

4. An electronic timepiece as claimed in claim 2, wherein said second circuit portion defines a driving circuit for supplying driving signals to a digital display.

5. An electronic timepiece as claimed in claim 4, wherein said first potential equals about 1.5 volts and said second potential is a higher voltage.

6. An electronic timepiece as claimed in claim 5, wherein said second potential higher than said first potential is about 3.0 volts.

* * * * *